United States Patent
Havens et al.

(10) Patent No.: US 6,822,446 B2
(45) Date of Patent: Nov. 23, 2004

(54) MRI MAGNET VIBRATION INDUCED FIELD INSTABILITY SIMULATOR

(75) Inventors: Timothy J. Havens, Florence, SC (US); Longzhi Jiang, Florence, SC (US); Gregory A. Lehmann, Florence, SC (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 10/065,037

(22) Filed: Sep. 12, 2002

(65) Prior Publication Data

US 2004/0051530 A1 Mar. 18, 2004

(51) Int. Cl.[7] .............................................. G01V 3/00
(52) U.S. Cl. ...................... 324/309; 324/318; 324/322
(58) Field of Search ................................ 324/307, 309, 324/318, 306, 322, 320, 319, 312; 364/413.13, 513, 148

(56) References Cited

U.S. PATENT DOCUMENTS

| | | | | | |
|---|---|---|---|---|---|
| 5,519,320 A | * | 5/1996 | Kanayama et al. | .......... | 324/309 |
| 5,744,959 A | * | 4/1998 | Jeker et al. | .................. | 324/319 |
| 6,191,582 B1 | * | 2/2001 | Zur | .............................. | 324/307 |
| 6,433,550 B1 | * | 8/2002 | Kinanen | ...................... | 324/320 |
| 6,556,012 B2 | * | 4/2003 | Yamashita | ................... | 324/318 |
| 2004/0051530 A1 | * | 3/2004 | Havens et al. | .............. | 324/318 |

OTHER PUBLICATIONS

Edelstein et al., article "Making MRI Quieter" Magnetic Resonance Imaging Vol. 20 Feb. 2002 pp. 155–163.*

* cited by examiner

*Primary Examiner*—Diego Gutierrez
*Assistant Examiner*—Tiffany A. Fetzner
(74) *Attorney, Agent, or Firm*—Carl B. Horton

(57) ABSTRACT

A Magnetic Resonance Imaging (MRI) magnet field instability simulator (80) is provided. The simulator includes a rigid body motion generator (82) that simulates motion of one or more MRI system components. An eddy current analyzer (84) generates a magnetic stiffness and damping signal and an electromagnetic transfer function in response to the motions and a cryostat material properties signal. A mechanical model generator (86) generates a mechanical disturbance signal and a mechanical model of one or more MRI system components in response to the motions and the magnetic stiffness and damping signal. A structural analyzer (88) generates a motion signal in response to the mechanical model. A field instability calculator (90) generates a field instability signal in response to the electromagnetic transfer function and the motion signal. A method of performing the same is also provided.

20 Claims, 2 Drawing Sheets

MRI MAGNET VIBRATION INDUCED FIELD INSTABILITY SIMULATOR

BACKGROUND OF THE INVENTION

The present invention relates generally to Magnetic Resonance Imaging (MRI) systems, and more particularly, to a method and system for simulating MRI magnet field instability due to mechanical disturbances.

Currently, Magnetic Resonance Imaging (MRI) systems have included a superconducting magnet that generates a temporally constant primary magnetic field. The superconducting magnet must keep the coils at approximately 4K for low temperature superconductors. The superconducting magnet is contained within a helium vessel having a radiation shield assembly. The vessel is referred to as a cryostat. A cryocooler maintains the superconducting magnet at a temperature of 4.2K.

The superconducting magnet is used in conjunction with a magnetic gradient coil assembly, which is sequentially pulsed to create a sequence of controlled gradients in the main magnetic field during a MRI data gathering sequence. The superconducting magnet and the magnetic gradient coil assembly have a radio frequency (RF) coil on an inner circumferential side of the magnetic gradient coil assembly. The controlled sequential gradients are effectuated throughout a patient imaging volume (patient bore) which is coupled to at least one MRI (RF) coil or antennae. The RF coils and a RF shield are typically located between the magnetic gradient coil assembly and the patient bore.

As a part of a typical MRI, RF signals of suitable frequencies are transmitted into the patient bore. Nuclear magnetic resonance (nMR) responsive RF signals are received from the patient via the RF coils. Information encoded within the frequency and phase parameters of the received RF signals, by the use of a RF circuit, is processed to form visual images. These visual images represent the distribution of nMR nuclei within a cross-section or volume of the patient within the patient bore.

Mechanical disturbances within the MRI system create eddy currents causing electro-magnetic field instability within the MRI system. The electro-magnetic field instability detrimentally effects image quality. To maintain high quality images during operating conditions, the superconducting magnet requires very high main field stability in order to minimize ghosting or false images.

The mechanical disturbances are due to both internally and externally caused mechanical movement of MRI system components. Examples of some internal mechanical disturbances are cryostat vibration, superconducting magnet movement, and gradient coil movement due to induced impulses. The cryostat is coupled to a pump which, when operating, causes the cryostat to vibrate or generate mechanical impulses, disturbing the main field. Both the superconducting magnet and the magnetic gradient coil assembly are impulsed during operation causing magnetic coils positions to be altered and mechanical movement to exist within the main magnetic field. A one micro-inch motion of the magnet can produce sufficient field instability to cause a ghosting problem. An example of an externally caused mechanical disturbance is environmental movement from human activity around the MRI system causing floor vibrations to transfer into the MRI system.

It would therefore be desirable to design the superconducting magnet, supporting structures, and related components so as to minimize mechanical disturbances, thereby, minimizing induced main field disturbances and ensuring and potentially increasing image quality.

SUMMARY OF THE INVENTION

The present invention provides a method and apparatus for simulating MRI magnet field instability due to mechanical disturbance. A Magnetic Resonance Imaging (MRI) magnet field instability simulator is provided. The simulator includes a rigid body motion generator that simulates motion of one or more MRI system components. An eddy current analyzer generates a magnetic stiffness and damping signal and an electromagnetic transfer function in response to the motions and a cryostat material properties signal. A mechanical model generator generates a mechanical disturbance signal and a mechanical model of one or more MRI system components in response to the motions and the magnetic stiffness and damping signal. A structural analyzer generates a motion signal in response to the mechanical model. A field instability calculator generates a field instability signal in response to the electromagnetic transfer function and the motion signal. A method of performing the same is also provided.

One of several advantages of the present invention is the ability to simulate effects of MRI main field disturbances within a MRI system. The simulation of these effects provides a design tool for better and more efficient engineering of MRI system components. Thus, providing a method of mimicking a resulting MRI system without the traditional time and expense involved in actual construction of the MRI system or system component.

Another advantage of the present invention is the ability to adjust MRI system component design within a relatively short period of time, along with quickly viewing the resulting effects of the alteration. Design by simulation trial and error, which was not normally practical for full MRI systems because of the large expense involved, is now feasible.

Furthermore, the present invention provides the ability to perform detailed analysis of MRI system components and relate the results of this analysis to mechanical disturbances and generated eddy currents.

Moreover, the present invention in simulation of field disturbances accounts for not only MRI system internally caused field disturbances but also externally caused field disturbances, allowing for design of externally related MRI system components.

The present invention itself, together with attendant advantages, will be best understood by reference to the following detailed description, taken in conjunction with the accompanying figures.

BRIEF DESCRIPTION OF DRAWINGS

For a more complete understanding of this invention reference should now be had to the embodiments illustrated in greater detail in the accompanying figures and described below by way of examples of the invention wherein.

DETAILED DESCRIPTION

Figure 1:
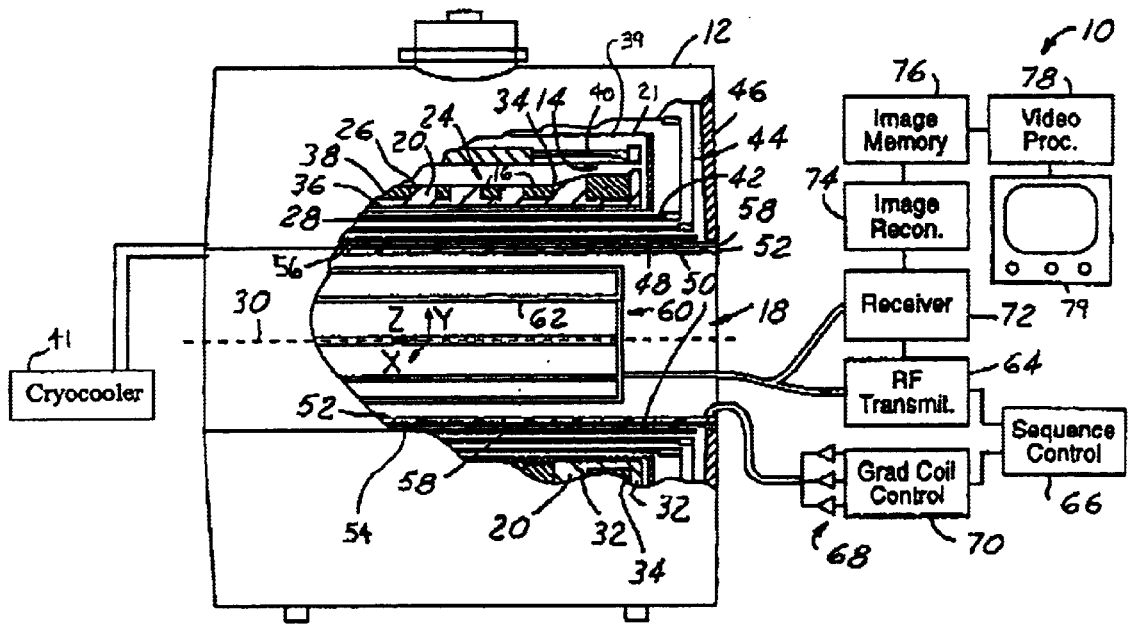
FIG. 1 is a cross-sectional view of a superconducting magnet support structure.

In each of the following figures, the same reference numerals are used to refer to the same components. While the present invention is described with respect to a method and apparatus for simulating and determining field instability within a MRI system, the present invention may be adapted to simulate field instability within various systems including: MRI systems, magnetic resonance spectroscopy systems, and other applications where field instability is an issue in the design of system components.

In the following description, various operating parameters and components are described for one constructed embodiment. These specific parameters and components are included as examples and are not meant to be limiting.

Also in the following description, a MRI system component may include any one of the following: a superconducting magnet, a superconducting magnet support structure, a gradient magnet assembly, a cryostat, a cryocooler, a cryostat support structure, or any other MRI system component known in the art.

Referring now to FIG. 1, a block diagrammatic view of a MRI system 10 is shown. The MRI system 10 includes a static magnet structure 12 comprising a superconducting magnet 14 having a plurality of superconducting magnetic field coils 16 which generate a temporally constant magnetic field along a longitudinal z-axis of a patient bore 18. The superconducting magnet coils 16 are supported by a superconducting magnet coil support structure 20 and received in a cryostat 21.

The superconducting magnet coil support structure 20 provides support for static loads and allows fabrication and accurate placement of coils 16. Only one superconducting magnet 14 and one superconducting magnet coil support structure 20 are shown, however, the disclosed system may have multiple superconducting magnets and superconducting magnet coil support structures.

The superconducting magnet coil support structure 20 is preferably a solid body and includes an exterior side 24, an exterior portion 26, and an interior side 28. The exterior side 24 is the longitudinal side farthest away from the center 30 of the patient bore 18 that supports the superconducting magnet 14. The exterior side 24 has a plurality of shoulders 32 and a plurality of pockets 34. The plurality of shoulders 32 and the plurality of pockets 34 have dimensions corresponding to dimensions of the superconducting magnet 14. The interior portion 26 is the solid body of the superconducting magnet coil support structure 20. The interior portion 26 has a base 36. The plurality of shoulders 32 are integrally connected to the external side 38 of the base 36. The interior side 28 is preferably cylindrical shaped and is the side closest to the center 30 of the patient bore 14.

Cryostat 21 includes toroidal helium vessel 39 and main magnetic field shield coil assembly 40. The cryostat 21 is coupled to a cryocooler 41. The cryocooler 41 maintains the helium vessel 39 at proper operating temperatures.

The main magnetic field shield coil assembly 40 generates a magnetic field that opposes the field generated by the superconducting magnet coils 16. A first coil shield 42 surrounds the helium vessel 39 to reduce boil-off. A second coil shield 44 surrounds the first coil shield 42. Both the first coil shield 42 and the second coil shield 44 are preferably cooled by mechanical refrigeration. The first coil shield 42 and the second coil shield 44 encases a toroidal vacuum vessel 46. The toroidal vacuum vessel 46 comprises a cylindrical member 48 that defines the patient bore 18 and extends parallel to a longitudinal axis. On a first exterior side 50 of the cylindrical member 48, which is longitudinal side farthest away from the center 30, of the patient bore 18 is a magnetic gradient coil assembly 52. Located on a second exterior side 54 of the magnetic gradient coil assembly 52 is a cylindrical dielectric former 56. A RF shield 58 is applied to the cylindrical dielectric former 56.

The patient bore 18 has a RF coil assembly 60 (antennae) mounted therein. The RF coil assembly 60 includes a primary RF coil 62 and the RF shield 58.

A RF transmitter 64 is connected to a sequence controller 66 and the primary RF coil 62. The RF transmitter 64 is preferably digital. The sequence controller 66 controls a series of current pulse generators 68 via a gradient coil controller 70 that is connected to the magnetic gradient coil assembly 52. The RF transmitter 64 in conjunction with the sequence controller 66 generates pulses of radio frequency signals for exciting and manipulating magnetic resonance in selected dipoles of a portion of the subject within the patient bore 18.

A radio frequency receiver 72 is connected with the primary RF coil 62 for demodulating magnetic resonance signals emanating from an examined portion of the subject. An image reconstruction apparatus 74 reconstructs the received magnetic resonance signals into an electronic image representation that is stored in an image memory 76. A video processor 78 converts stored electronic images into an appropriate format for display on a video monitor 79.

Figure 2:
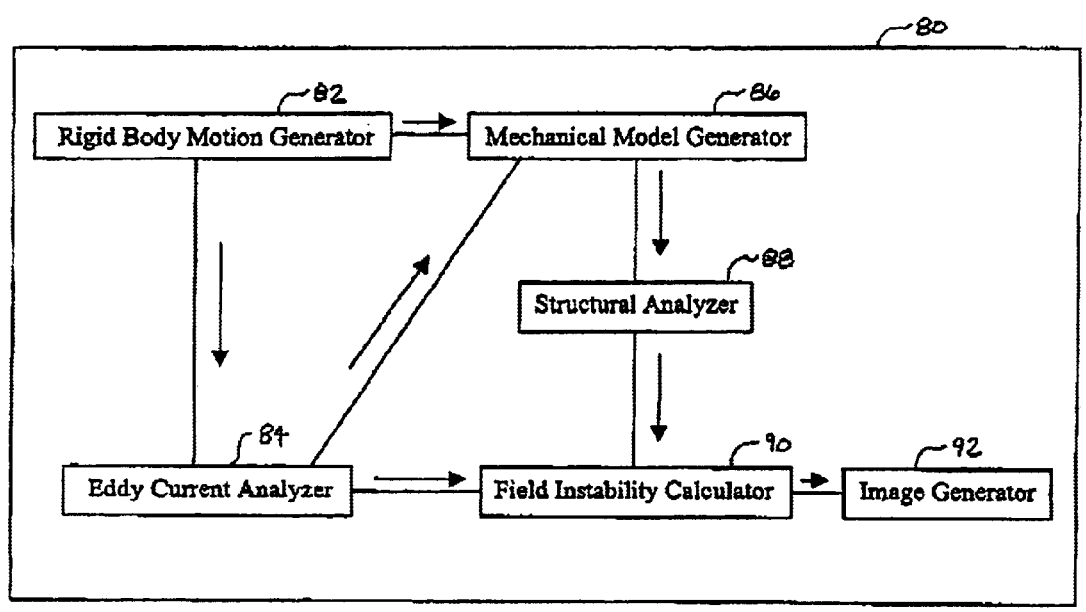
FIG. 2 is a block diagrammatic view of a Magnetic Resonance Imaging (MRI) magnet field instability simulator in accordance with an embodiment of the present invention.

Referring now to FIG. 2, a block diagrammatic view of a MRI magnet field instability simulator 80 in accordance with an embodiment of the present invention, is shown.

The simulator 80 includes a rigid body motion generator 82 that simulates motion of a MRI system component. An eddy current analyzer 84 is coupled to the rigid body motion generator 82 and simulates resulting eddy currents within the main field as a result of the rigid body motions and generates a corresponding electromagnetic transfer function. A mechanical model generator 86 is coupled to the eddy current analyzer 84. The mechanical model generator 86 generates a mechanical model of specified MRI system components, representing a given MRI system, for structural analysis by a structural analyzer 88. The structural analyzer 88 generates a motion signal, which is combined with the electromagnetic transfer function by a field instability calculator 90 to determine field instability for the specified MRI system components. An image generator 92 relays information pertaining to the field instability to a system operator. The image generator 92 may include graphing software and a visual monitor, as known in the art.

The simulator 80 is preferably microprocessor based such as a computer having a central processing unit, memory (RAM and/or ROM), and associated input and output buses. The simulator components 82, 84, 86, 88, 90, and 92 may be software or hardware based and may be part of a single controller, such as simulator 80, or may each be separate stand-alone components. The simulator components" functions are described in greater detail below.

Figure 3:
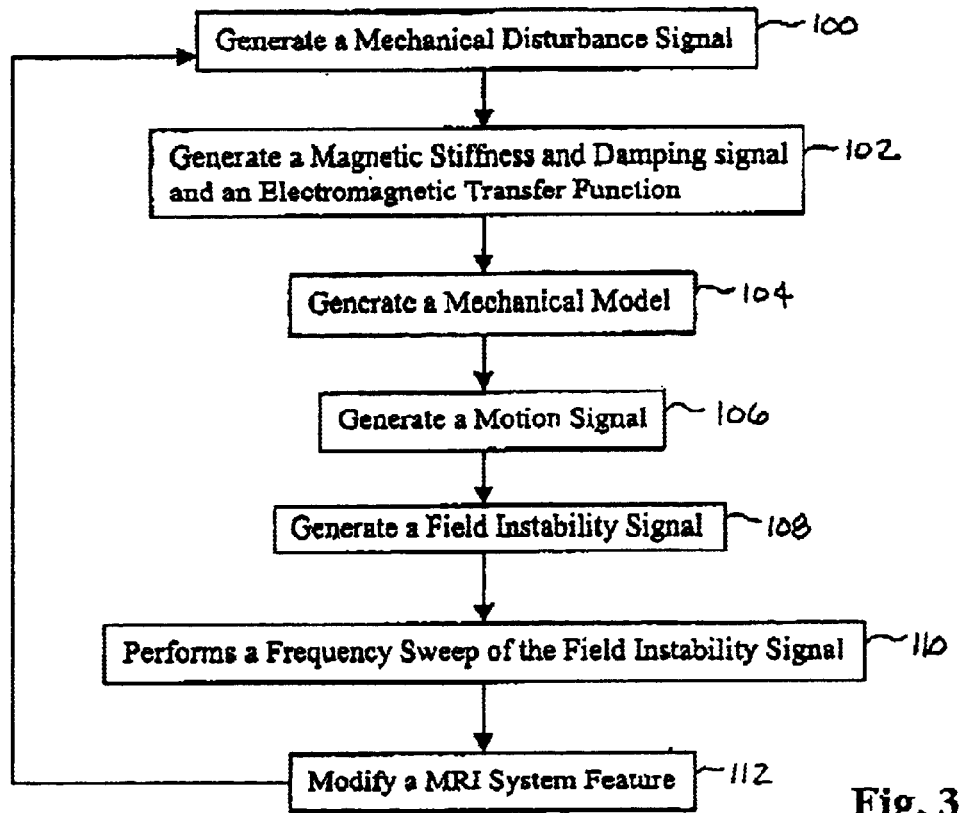
FIG. 3 is a logic flow diagram illustrating a method of simulating and determining field instability within a MRI system in accordance with an embodiment of the present invention.

Referring now to FIG. 3, a logic flow diagram illustrating a method of simulating and determining field instability within the MRI system 10 in accordance with an embodiment of the present invention, is shown.

In step 100, the motion generator 82 simulates motions of one or more MRI system components, which in effect is simulating a rigid body motion. For example, the superconducting magnet 14, the gradient coil assembly 52, and the cryostat 21 are all pulsed or excited during operation generating mechanical motion, i.e. mechanical disturbances, within the main field. More specifically, the cryocooler 40 when in operation, as with most machines, generates vibration or impact pulses, which are transferred into the cryostat 21. The impact pulses create main field disturbances within the MRI system 10. The mechanical motions are simulated by the motion generator 82. The motion generator 82, using known material properties and characteristics of a MRI system component of concern as well as other MRI system components, simulates motion of the component of interest under various operating conditions. Thus, continuing on from the above example, the motion generator 82 using material properties and characteristics of the cryostat 21 and other MRI system components simulates motion of the cryostat 21 within the main field, during selected operating conditions.

In step 102, the eddy current analyzer 84 generates a magnetic stiffness and damping signal and an electromagnetic transfer function in response to the simulated motions and a cryostat material properties signal. The cryostat material property signal is generated by the simulator 80 and contains material property information corresponding to various MRI system components. The magnetic stiffness and damping signal corresponds to magnetic resistance force due to eddy current. So, even though eddy current is undesirable in that it effects image quality, it is desirable in that it provides resistance for restraining or limiting the amount of movement in the main field. A balance is struck, in designing a MRI system component, between a desired amount of magnet stiffness and damping versus an undesirable amount of motion. The electromagnetic transfer function is the result of performing an eddy current analysis using information contained within the cryostat material properties signal and the simulated motions. The electromagnetic transfer function relates field disturbance and component or unit motion.

In step 104, the mechanical model generator 86 generates a mechanical disturbance signal and a mechanical model of the MRI system 10 or of one or more MRI system components in response to the simulated motions and the magnetic stiffness and damping signal. The mechanical disturbance signal corresponds to the simulated motions. The mechanical model includes MRI system component geometries, MRI system component materials and respective properties, boundary conditions, and may include other system parameters and characteristics known in the art. The mechanical model may be as simple as a model of the superconducting magnet 14 or may be more complex and include other MRI system components.

In step 106, the structural analyzer 88 generates a motion signal in response to said mechanical model. In generating the motion signal the structural analyzer 88 performs a structural analysis of one or more MRI system components. The structural analyzer 88 converts nodal displacements, corresponding to points on a MRI system component, into rigid body motions. The motion signal may, for example, contain cryostat 21 and magnet coil displacement information, to allow for modifications to a portion of a MRI system component.

In step 108, the field instability calculator 90 generates a field instability signal in response to the electromagnetic transfer function and the motion signal. The field instability calculator 90 generates the field instability signal by multiplying the mechanical disturbance signal by the electromagnetic transfer function to produce field instability for a given excitation frequency.

Figure 4:
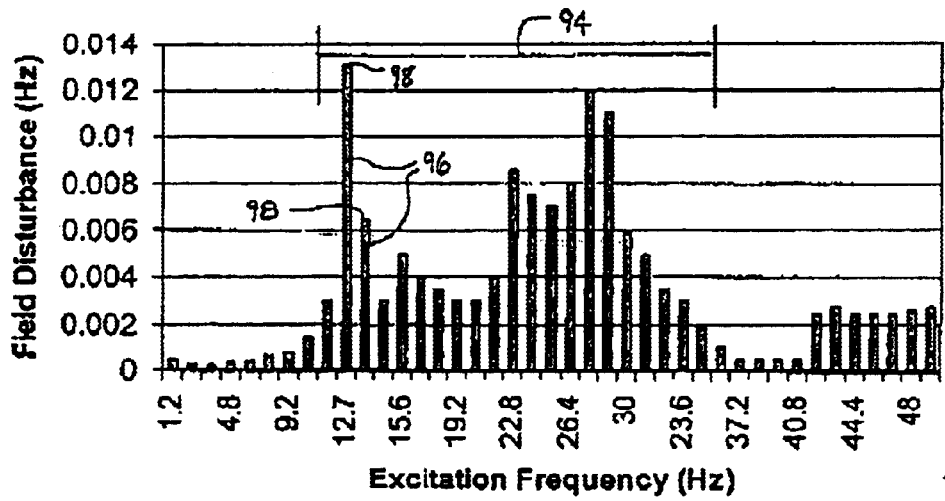
FIG. 4 is an example plot of field instability, at an off-center position of an image volume, due to cryocooler excitation in accordance with an embodiment of the present invention.

In step 110, the simulator 80 performs a frequency sweep of the field instability signal to obtain a desired frequency operating range. The simulator 80 generates a plot of field disturbance in frequency versus excitation frequency at off-center positions of an image volume. The plot illustrates resonance or natural frequency of an interested MRI system component. A sample plot of field disturbance due to cryostat motion, is shown in FIG. 4. A resulting frequency operating band 94, is illustrated for a specified MRI system, which may be adjusted as stated in step 112. Each bar 96 represents a frequency field disturbance magnitude 98 associated with a certain excitation frequency.

In step 112, at least one MRI system feature such as a MRI system parameter, MRI system material, or MRI system characteristic is modified or adjusted such that the resulting frequency operating band 94 and frequency magnitudes 98 therein are within a desired resulting frequency operating band and below desired frequency magnitudes, respectively. The modification may be performed manually by the system operator or by the simulator 80. An example would be to adjust material of the cryostat 21 or of a cryostat support structure to increase or decrease stiffness and thereby increasing or decreasing the amount of cryostat motion. A desirable balance between resulting eddy current and a resulting amount of movement in the main field is achieved in response to the field instability signal. Upon completion of step 112 the simulator 80 returns to step 100 unless the resulting frequency magnitudes 98 and frequency operating band 94 are approximately equal to or within desired frequency magnitudes and a desired frequency operating band.

The above-described steps are meant to be an illustrative example, the steps may be performed synchronously or in a different order depending upon the application.

The present invention therefore provides a MRI magnet field instability simulator that provides increased MRI system design capability. The present invention allows a design engineer to simulate a MRI system and determine field instability for specified MRI system features and make design adjustments without actually manufacturing, installing, and testing a new MRI system component. The present invention decreases design time, manufacturing costs, and provides a tool for increasing MRI system performance.

The above-described apparatus, to one skilled in the art, is capable of being adapted for various purposes and is not limited to the following systems: MRI systems, magnetic resonance spectroscopy systems, and other applications where field instability is an issue in the design of system components. The above-described invention may also be varied without deviating from the spirit and scope of the invention as contemplated by the following claims.

What is claimed is:

1. A Magnetic Resonance Imaging (MRI) magnet field instability simulator comprising:

a rigid body motion generator simulating motions of one or more MRI system components;

an eddy current analyzer generating a magnetic stiffness and damping signal and an electromagnetic transfer function in response to said simulated motions and a cryostat material properties signal;

a mechanical model generator generating a mechanical disturbance signal and a mechanical model of one or more MRI system components in response to said simulated motions and said magnetic stiffness and damping signal;

a structural analyzer generating a simulated motion signal in response to said mechanical model; and a field instability calculator generating a field instability signal in response to said electromagnetic transfer function and said simulated motion signal.

2. A simulator as in claim 1 wherein said mechanical disturbance signal comprises at least one of an internal mechanical disturbance signal and an external mechanical disturbance signal.

3. A simulator as in claim 2 wherein said mechanical disturbance signal comprises information corresponding to at least one of cryostat motion, coil motion, magnet motion, and environmental motion.

4. A simulator as in claim 1 wherein said simulated motion signal comprises information corresponding to at least one of cryostat motion, coil motion, magnet motion, and environmental motion.

5. A simulator as in claim 1 wherein said mechanical model comprises at least one of magnet geometry, material properties, boundary conditions, and magnet stiffness and damping.

6. A simulator as in claim 1 wherein said structural analyzer converts nodal displacements into rigid body motions.

7. A simulator as in claim 6 wherein said field instability calculator multiplies said rigid body motions by said electromagnetic transfer function to produce said field instability signal.

8. A simulator as in claim 1 wherein said field instability signal comprises a frequency distribution of field disturbances.

9. A method of simulating and determining field instability within an MRI system comprising:
  simulating motions of one or more MRI system components;
  generating a magnetic stiffness and damping signal and an electromagnetic transfer function in response to said simulated motions and a cryostat material properties signal;
  generating a mechanical disturbance signal and a mechanical model of one or more MRI system components in response to said simulated motions and said magnetic stiffness and damping signal;
  generating a simulated motion signal in response to said mechanical model; and generating a field instability signal in response to said electromagnetic transfer function and said simulated motion signal.

10. A method as in claim 9 wherein generating an electromagnetic transfer function comprises performing an eddy current analysis.

11. A simulator as in claim 9 wherein generating a simulated motion signal comprises performing a structural analysis of one or more MRI system components.

12. A method as in claim 11 wherein performing a structural analysis comprises converting nodal displacements into rigid body motions.

13. A method as in claim 9 wherein generating said field instability signal comprises multiplying said mechanical disturbance signal by said electromagnetic transfer function.

14. A method as in claim 9 further comprising frequency sweeping said field instability signal to obtain a desired frequency operating range.

15. A method as in claim 9 further comprising modifying at least one MRI system feature to adjust one or more resulting frequency magnitudes.

16. A method as in claim 9 further comprising modifying at least one MRI system feature to adjust a resulting frequency operating band to be approximately within a desired frequency operating range.

17. A method as in claim 9 further comprising balancing a resulting eddy current with a resulting amount of MRI system component movement in response to said field instability signal.

18. A method as in claim 9 further comprising modifying a cryostat or cryostat support material in response to said field instability signal.

19. A method of simulating and determining field instability within an MRI system comprising:
  simulating motions of one or more MRI system components;
  generating a magnetic stiffness and damping signal and an electromagnetic transfer function in response to said simulated motions and a cryostat material properties signal;
  generating a mechanical disturbance signal and a mechanical model of one or more MRI system components in response to said simulated motions and said magnetic stiffness and damping signal;
  generating a simulated motion signal in response to said mechanical model; and generating a field instability signal in response to said electromagnetic transfer function and said simulated motion signal;
  frequency sweeping said field instability signal to obtain a desired frequency operating range;
  modifying at least one MRI system feature to adjust said field instability signal wherein a resulting frequency operating band is adjusted to be within said desired frequency operating range.

20. A method as in claim 19 further comprising:
  balancing a resulting eddy current with a resulting amount of MRI system component movement in response to said field instability signal to determine desired cryostat materials; and
  modifying a cryostat or cryostat support material to reflect said desired cryostat materials.

* * * * *